United States Patent
Choi (10) Patent No.: US 9,065,073 B2
(45) Date of Patent: Jun. 23, 2015

(54) ORGANIC LIGHT-EMITTING DISPLAY APPARATUS AND METHOD OF MANUFACTURING THE SAME

(71) Applicant: Samsung Display Co, Ltd., Yongin (KR)

(72) Inventor: Jung-Ho Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/797,667

(22) Filed: Mar. 12, 2013

(65) Prior Publication Data

US 2014/0117316 A1 May 1, 2014

(30) Foreign Application Priority Data

Oct. 30, 2012 (KR) ........................ 10-2012-0121541

(51) Int. Cl.
*H01L 29/04* (2006.01)
*H01L 51/52* (2006.01)

(52) U.S. Cl.
CPC .................................. *H01L 51/5253* (2013.01)

(58) Field of Classification Search
CPC .. G06F 3/0412; H01L 27/323; H01L 51/5237
USPC .................. 257/40; 438/34; 445/25
See application file for complete search history.

(56) References Cited

U.S. PATENT DOCUMENTS

| | | | |
|---|---|---|---|
| 8,575,641 B2 * | 11/2013 | Zimmerman et al. | 257/98 |
| 2005/0110023 A1 * | 5/2005 | Lee et al. | 257/72 |
| 2007/0252526 A1 | 11/2007 | Aitken et al. | |
| 2011/0140164 A1 | 6/2011 | Seo et al. | |
| 2011/0279410 A1 * | 11/2011 | Han et al. | 345/174 |

FOREIGN PATENT DOCUMENTS

| | | |
|---|---|---|
| JP | 2011-213847 | 10/2011 |
| KR | 1020090047885 A | 5/2009 |
| KR | 10-2010-0050470 A | 5/2010 |
| KR | 10-2011-0067411 | 6/2011 |

* cited by examiner

*Primary Examiner* — Thomas L Dickey
(74) *Attorney, Agent, or Firm* — Knobbe Martens Olson & Bear LLP (57) ABSTRACT

Provided are an organic light-emitting display device and a method of manufacturing the organic light-emitting display device, the method including operations of forming pattern layers in an active area and a pad area, respectively, on a substrate; and forming an encapsulation thin-film layer that covers the pattern layers on the substrate, wherein the operation of the encapsulation thin-film layer may include an operation of forming the encapsulation thin-film layer on the substrate by using a raw material of the encapsulation thin-film layer that is a single layer comprising an inorganic material.

18 Claims, 7 Drawing Sheets

ORGANIC LIGHT-EMITTING DISPLAY APPARATUS AND METHOD OF MANUFACTURING THE SAME

CROSS-REFERENCE TO RELATED APPLICATIONS

This application claims the benefit of Korean Patent Application No. 10-2012-0121541, filed on Oct. 30, 2012, in the Korean Intellectual Property Office, the disclosure of which is incorporated herein in its entirety by reference.

BACKGROUND

1. Field

The present embodiments relate to an organic light-emitting display apparatus, and more particularly, to an organic light-emitting display apparatus and a method of manufacturing the same, whereby the display apparatus has a decreased weight and thickness.

2. Description of the Related Technology

In general, organic light-emitting display apparatuses are self-emissive display apparatuses having a wide viewing angle, an excellent contrast ratio, and a high response time.

Accordingly, the organic light-emitting display apparatuses are highlighted as they can be applied to mobile display apparatuses such as a digital camera, a video camera, a camcorder, a portable information terminal, a smart phone, an ultra-slim notebook, a tablet personal computer, a flexible display apparatus, or the like, or can be applied to electronic/electric appliances such as ultra-slim televisions.

Organic light-emitting display apparatus may realize colors in a manner that a hole and an electron that are injected into an anode and a cathode, respectively, are recombined and emit light in an emission layer (EML), and in this regard, when an exciton that is combination of the hole and the electron turns to a ground state from an excited state, emission occurs.

Since the organic light-emitting display apparatus is weak to moisture, an encapsulation process is performed to encapsulate a substrate whereon a thin-film layer is formed. However, when the encapsulation process is performed, if an encapsulation member has a large thickness, it is difficult to achieve a light weight and slimness of an organic light-emitting display apparatus.

SUMMARY

The present embodiments provide an organic light-emitting display apparatus having a decreased thickness and a light weight by having a single-layered encapsulated thin-film layer formed on a substrate whereon an organic light-emitting device is formed, and a method of manufacturing the organic light-emitting display apparatus.

According to an aspect of the present embodiments, there is provided a method of manufacturing an organic light-emitting display device, the method including operations of forming pattern layers in an active area and a pad area, respectively, on a substrate; and forming an encapsulation thin-film layer that covers the pattern layers on the substrate, wherein the operation of forming the encapsulation thin-film layer includes an operation of forming the encapsulation thin-film layer on the substrate by using a raw material of the encapsulation thin-film layer that is a single layer comprising an inorganic material.

The operation of forming the pattern layers may include operations of forming a semiconductor active layer, a first insulating layer, a gate electrode, a second insulating layer, source and drain electrodes, a third insulating layer, and a first electrode of an organic light-emitting device in the active area on the substrate, and forming a pad terminal in the pad area on the substrate; forming a fourth insulating layer that covers the first electrode while exposing a portion of the first electrode, and that covers the pad terminal; and forming an organic emission layer (organic EML) and a second electrode of the organic light-emitting device on the fourth insulating layer.

The first through third insulating layers may be formed while extending over the active area and the pad area on the substrate, and the source and drain electrodes, and the pad terminal may be formed together on the third insulating layer.

The operation of forming the fourth insulating layer may include an operation of performing a half-tone exposure operation on a raw material of the fourth insulating layer in the active area and performing a non-exposure operation on a raw material of the fourth insulating layer in the pad area, whereby a thickness of the fourth insulating layer in the active area may be different from a thickness of the fourth insulating layer in the pad area.

The thickness of the fourth insulating layer in the pad area may be greater than the thickness of the fourth insulating layer in the active area.

A height of the organic light-emitting device having the first electrode, the organic EML, and the second electrode may be less than a height of the fourth insulating layer in the pad area.

The operation of forming the encapsulation thin-film layer may include operations of coating, hardening, and etching the raw material of the encapsulation thin-film layer that covers all of the active area and the pad area.

The operation of etching the encapsulation thin-film layer may include an operation of exposing a top surface of the fourth insulating layer formed in the pad area.

A touch screen pattern may be further formed on a top surface of the fourth insulating layer formed in the active area.

The operation of forming the encapsulation thin-film layer may include operations of coating the raw material of the encapsulation thin-film layer on the substrate; hardening the encapsulation thin-film layer at a temperature equal to or less than about 200° C.; and completing the encapsulation thin-film layer by etching the raw material of the encapsulation thin-film layer.

The encapsulation thin-film layer may include an inorganic material selected from the group consisting of polysilazane containing $SiO_2$ as a main component, borate glass containing $B_2O_3$ as a main component, phosphate glass containing $P_2O_5$ as a main component, tellurite-based composition containing $TeO_2$ as a main component, bismuth oxide-based composition containing $Bi_2O_3$ as a main component, and chalcogenide-based composition containing at least one element selected from the group consisting of S, Se, and Te.

According to another aspect of the present embodiments, there is provided an organic light-emitting display device including a substrate; a thin-film transistor (TFT) formed in an active area on the substrate, and including a semiconductor active layer, a first insulating layer, a gate electrode, a second insulating layer, source and drain electrodes, and a third insulating layer; an organic light-emitting device electrically connected to the TFT, and comprising a first electrode, an organic emission layer (organic EML), and a second electrode, wherein a portion of the first electrode is exposed by a fourth insulating layer; a pad terminal formed in a pad area on the substrate; and an encapsulation thin-film layer covering the TFT and the organic light-emitting device, and formed as a single layer including an inorganic material.

The encapsulation thin-film layer may include an inorganic material selected from the group consisting of polysilazane containing $SiO_2$ as a main component, borate glass containing $B_2O_3$ as a main component, phosphate glass containing $P_2O_5$ as a main component, tellurite-based composition containing $TeO_2$ as a main component, bismuth oxide-based composition containing $Bi_2O_3$ as a main component, and chalcogenide-based composition containing at least one element selected from the group consisting of S, Se, and Te.

A touch screen may be further formed on an exterior surface of the fourth insulating layer.

BRIEF DESCRIPTION OF THE DRAWINGS

The above and other features and advantages of the present embodiments will become more apparent by describing in detail example embodiments thereof with reference to the attached drawings in which:

FIGS. 1A through 1E are cross-sectional views that sequentially illustrate processes of manufacturing an organic light-emitting display device according to an embodiment;

DETAILED DESCRIPTION

The present embodiments will now be described more fully with reference to the accompanying drawings, in which example embodiments are shown. The present embodiments may, however, be embodied in many different forms, and should not be construed as being limited to the embodiments set forth herein. Thus, the present embodiments may include all revisions, equivalents, or substitutions which are included in the concept and the technical scope related to the present embodiments. In the description of the present embodiments, certain detailed explanations of related art are omitted when it is deemed that they may unnecessarily obscure the essence of the present embodiments.

While such terms as "first," "second," etc., may be used to describe various components, such components must not be limited to the above terms. The above terms are used only to distinguish one component from another.

The terms used in the present specification are merely used to describe particular embodiments, and are not intended to limit the present embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the present embodiments will be described in detail by explaining example embodiments with reference to the attached drawings. Like reference numerals in the drawings denote like elements.

As used herein, the term "and/or" includes any and all combinations of one or more of the associated listed items.

Expressions such as "at least one of," when preceding a list of elements, modify the entire list of elements and do not modify the individual elements of the list.

FIGS. 1A through 1E are cross-sectional views that sequentially illustrate processes of manufacturing an organic light-emitting display device 100 according to an embodiment. FIG. 2 is a flowchart of a method of manufacturing the organic light-emitting display device 100 shown in FIGS. 1A through 1E.

Figure 1A:
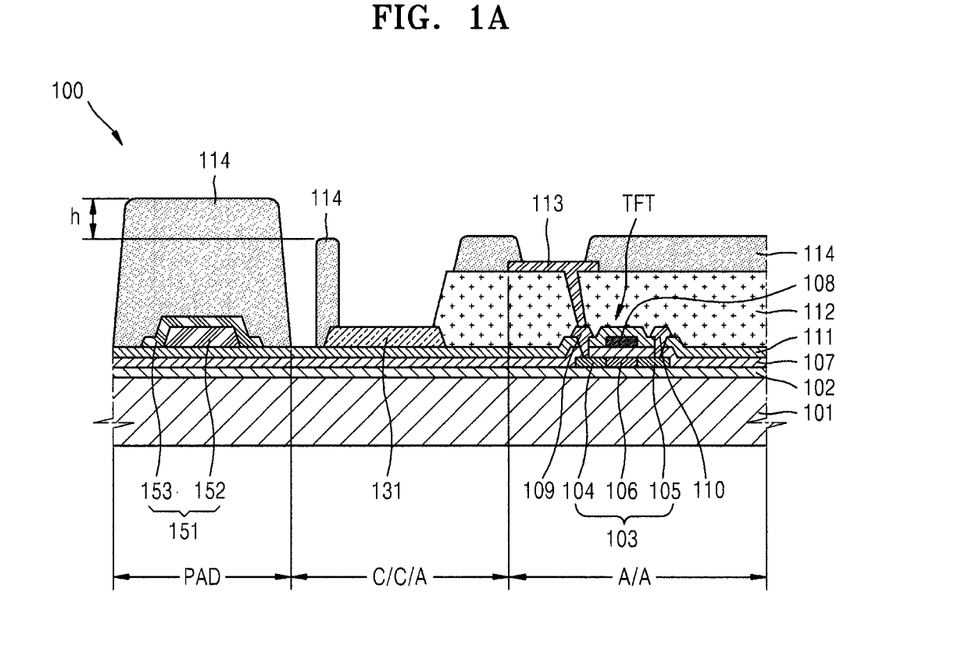
FIG. 1A is a cross-sectional view illustrating a status of the organic light-emitting display device after a fourth insulating layer is formed on a substrate.
Figure 2:
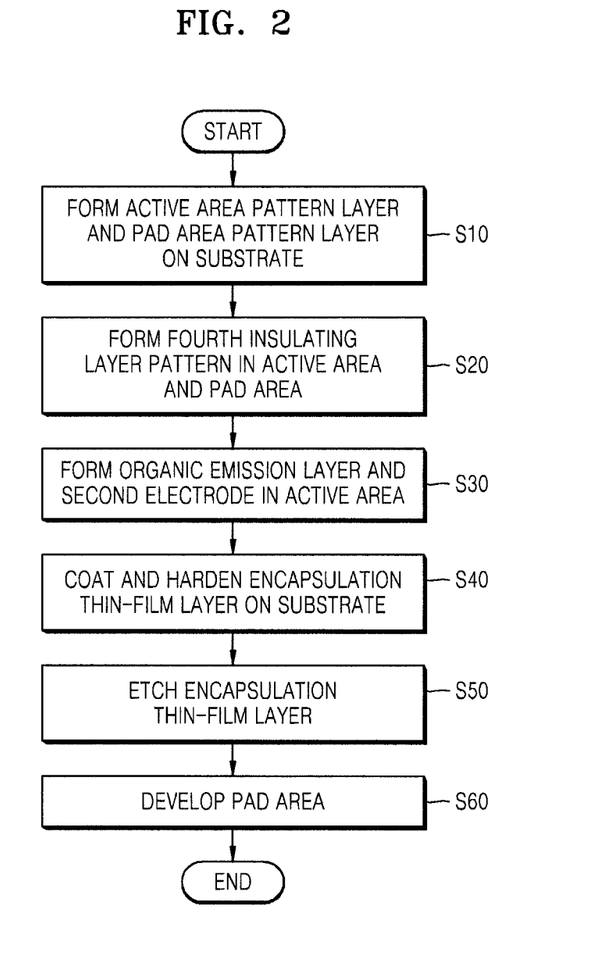
FIG. 2 is a flowchart of a method of manufacturing the organic light-emitting display device shown in FIGS. 1A through 1E.

Referring to FIG. 1A, a substrate 101 is arranged in the organic light-emitting display device 100. The substrate 101 may include an insulating substrate comprising glass or plastic.

A barrier layer 102 is formed on a surface of the substrate 101. The barrier layer 102 may be an inorganic layer including SiOx, SiNx, SiON, AlO, AlON, or the like, may be an organic layer including acryl, polyimide, or the like, or may be a composite layer in which an organic layer and an inorganic layer are alternately stacked. The barrier layer 102 prevents oxygen and moisture from penetrating into an active area A/A, a cathode contact area C/C/A, or a pad area PAD via the substrate 101.

Pattern layers are formed in the active area A/A, the cathode contact area C/C/A, and the pad area PAD, respectively (operation S10).

A thin-film transistor (TFT) is formed in the active area A/A.

The TFT according to the present embodiment corresponds to a top gate type TFT but may include a different type TFT such as a bottom gate type TFT. Also, the active area A/A not only includes a region for the TFT but also includes a pixel region and a capacitor region.

A semiconductor active layer 103 having a predetermined pattern is formed on the barrier layer 102. When the semiconductor active layer 103 comprises polysilicon, the semiconductor active layer 103 may be formed in a manner that amorphous silicon is first formed and then is crystallized into polysilicon.

In order to crystallize amorphous silicon, various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like may be used.

A first insulating layer 107 corresponding to a gate insulating layer is deposited on the semiconductor active layer 103. The first insulating layer 107 may have a single-layer structure including $SiO_2$ or a double-layer structure including $SiO_2$ and $SiN_x$.

A gate electrode 108 is formed on a predetermined region of the gate insulating layer 107. The gate electrode 108 is connected to a gate line (not shown) to apply TFT on/off signals to the TFT. The gate electrode 108 may be formed as a single layer including Mo, MoW, Cr, an Al alloy, Mg, Al, Ni, W, Au, or the like or may have a multi-layer structure including combinations thereof.

A source region 104 and a drain region 105 are formed in a manner that n-type impurity ion or p-type impurity ion is doped on the semiconductor active layer 103 while the gate electrode 108 is used as a mask. A region between the source region 104 and the drain region 105 is used as a channel region 106 that is not doped with impurity.

A second insulating layer 111 corresponding to an interlayer insulating layer is formed on the gate electrode 108. The second insulating layer 111 may comprise an insulating material such as $SiO_2$ or $SiN_x$, or may comprise an insulating organic material.

Contact holes (not shown) are formed by selectively removing the first insulating layer 107 and the second insulating layer 111, and surfaces of the source region 104 and the drain region 105 are partially exposed due to the formation of the contact holes.

A source electrode 109 and a drain electrode 110 that are electrically connected to the source region 104 and the drain region 105, respectively, via the contact holes are formed on the exposed surfaces of the source region 104 and the drain region 105.

A third insulating layer 112 corresponding to a protective layer (e.g., a passivation layer and/or a planarization layer) that comprises $SiO_2$ or $SiN_x$ is formed on the source electrode 109 and the drain electrode 110.

The third insulating layer 112 may comprise an organic material including acryl, benzocyclobutene (BCB), polyimide (PI), or the like, or may comprise an inorganic material including $SiN_x$. Also, the third insulating layer 112 may have one of various structures including a single-layer structure, a dual-layer structure, and a multi-layer structure.

A first electrode 113 is formed on the third insulating layer 112 by etching the third insulating layer 112, and corresponds to a pixel electrode of an organic light-emitting device OLED which is electrically connected to one of the source electrode 109 and the drain electrode 110 via the contact hole.

The first electrode 113 may function as an anode electrode and may comprise various conductive materials. According to a characteristic of the organic light-emitting device OLED, the first electrode 113 may be formed as a transparent electrode or a reflective electrode.

For example, when the first electrode 113 is used as the transparent electrode, the first electrode 113 may include ITO, IZO, ZnO, or $In_2O_3$, and when the first electrode 113 is used as the reflective electrode, the first electrode 113 may be formed in a manner that a reflective layer comprises a material including Ag, Mg, Al, Pt, Pb, Au, Ni, Nd, Ir, Cr, or compound of any of these, and then a material including ITO, IZO, ZnO, $In_2O_3$, or the like is formed on the reflective layer.

With respect to the cathode contact area C/C/A, some pattern layers of the cathode contact area C/C/A are formed in the same process as a process of forming pattern layers of the active area A/A.

In the cathode contact area C/C/A, the barrier layer 102, the first insulating layer 107 corresponding to the gate insulating layer, and the second insulating layer 111 corresponding to the interlayer insulating layer are sequentially stacked on the substrate 101. A type of an insulating layer formed in the cathode contact area C/C/A is not limited, provided that at least one of the barrier layer 102, the first insulating layer 107, and the second insulating layer 111 is formed in the cathode contact area C/C/A.

Wiring 131 is formed on the second insulating layer 111. The wiring 131 may be simultaneously formed by using the same material as the source electrode 109 and/or the drain electrode 110 when the source electrode 109 and/or the drain electrode 110 are formed in the active area A/A. A portion of the third insulating layer 112 that corresponds to the protective layer covers a side end of the wiring 131.

In the pad area PAD, the barrier layer 102, the first insulating layer 107 corresponding to the gate insulating layer, and the second insulating layer 111 corresponding to the interlayer insulating layer are sequentially stacked on the substrate 101, but a type of an insulating layer formed in the pad area PAD is not limited thereto.

A pad terminal 151 is formed on the second insulating layer 111. The pad terminal 151 includes a first part 152 that comprises the same material as the first insulating layer 107 when the first insulating layer 107 is formed in the active area A/A, and a second part 153 that comprises the same material as the source electrode 109 or the drain electrode 110.

In the present embodiment, the second part 153 completely surrounds the first part 152 but aspects of the present embodiments are not limited thereto only if the second part 153 is formed on the first part 152. Also, the pad terminal 151 may comprise a conductive material and may have a single-layer or multi-layer structure including at least one of the first insulating layer 107, the source electrode 109, and the drain electrode 110.

As described above, after pattern layers are formed in the active area A/A, the cathode contact area C/C/A, and the pad area PAD, a pattern of a fourth insulating layer 114 having different thicknesses is formed (operation S20).

The fourth insulating layer 114 corresponding to a pixel-defining layer (PDL) is formed on the first electrode 113 so as to cover sides of the first electrode 113. The PDL surrounds the sides of the first electrode 113, thereby defining an emission region. By removing a portion of the PDL, a portion of the first electrode 113 is externally exposed.

The PDL may comprise an organic material or an inorganic material. For example, the PDL may comprise the organic material including polyimide, polyamide, acryl resin, benzocyclobutene, or phenol resin, or may comprise the inorganic material including $SiN_x$. Also, the PDL have one of various structures including a single-layer structure, a dual-layer structure, and a multi-layer structure.

The fourth insulating layer 114 is also formed in the cathode contact area C/C/A. The fourth insulating layer 114 covers a side end of the wiring 131. The fourth insulating layer 114 is also formed in the pad area PAD, and completely surrounds the pad terminal 151.

Here, the fourth insulating layer 114 that is patterned in the active area A/A, the cathode contact area C/C/A, and the pad area PAD have the different thicknesses.

To do so, when a raw material to form the fourth insulating layer 114 is coated and then is exposed by using a mask, a half-tone exposure operation is performed on the active area A/A and the cathode contact area C/C/A, and a non-exposure operation is performed on the pad area PAD.

Accordingly, a thickness of the fourth insulating layer 114 in the active area A/A and the cathode contact area C/C/A is greater than a thickness of the fourth insulating layer 114 in the pad area PAD by a value of h.

After the fourth insulating layer 114 having the different thicknesses in the active area A/A, the cathode contact area C/C/A, and the pad area PAD is formed, as illustrated in FIG. 1 B, an organic emission layer (organic EML) 115 and a second electrode 116 is formed in the active area A/A (operation S30).

Figure 1B:
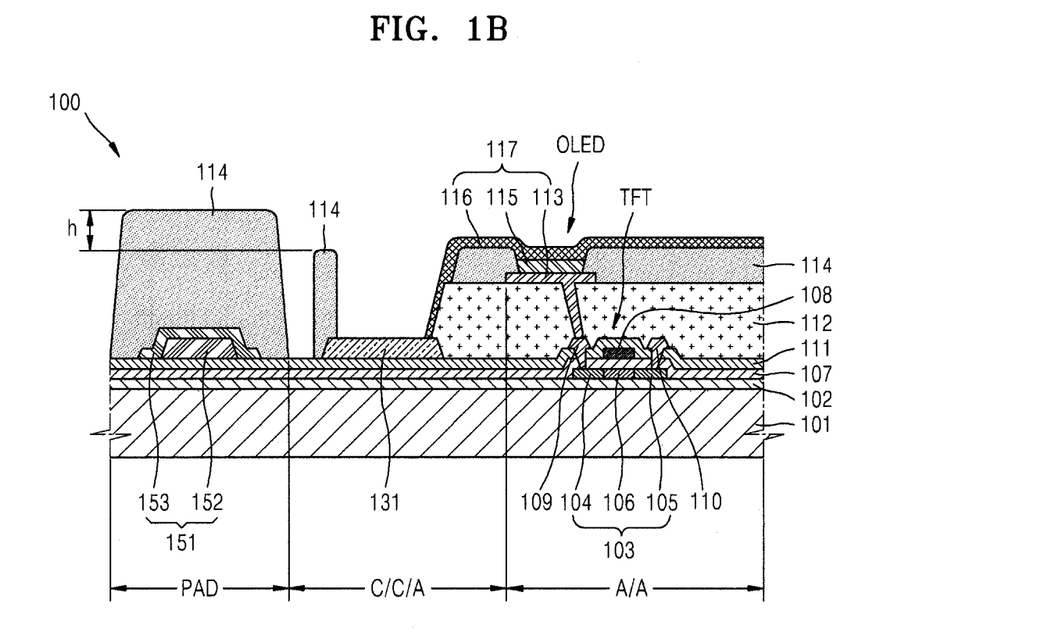
FIG. 1B is a cross-sectional view illustrating a status of the organic light-emitting display device after an organic light-emitting device is formed on the substrate of FIG. 1A.

The organic EML 115 is formed at a portion of the first electrode 113 which is externally exposed by removing a portion of the fourth insulating layer 114. In the present embodiment, the organic EML 115 is patterned to correspond to only each sub-pixel, e.g., the patterned first electrode 113. However, this pattern is shown only to describe a structure of a sub-pixel, and thus the organic EML 115 may be integrally formed with another adjacent sub-pixel. Alternatively, some layers of the organic EML 115 may be formed for each sub-pixel, and the other layers of the organic EML 115 may be integrally formed with the organic EML 115 of another adjacent sub-pixel.

The organic EML 115 may be formed by using as a small molecule organic material or a polymer organic material.

When the organic EML 115 comprises a small molecule organic material, the organic EML 115 may have a structure in which a hole injection layer (HIL), a hole transport layer (HTL), an EML, an electron transport layer (ETL), an electron injection layer (EIL) or the like are singularly or multiply stacked.

The organic EML may be formed by using one of various organic materials including copper phthalocyanine (CuPc), N,N'-Di(naphthalene-1-yl)-N,N'-diphenyl-benzidine (NPB), tris-8-hydroxyquinoline aluminum)(Alq3), or the like. The organic EML may comprise the small molecule organic material by using a vacuum deposition method using masks.

When the organic EML 115 comprises a polymer organic material, the organic EML 115 may have a structure including an HTL and an EML. The HTL comprises poly(3,4-ethylenedioxythiophene) (PEDOT), and the EML comprises a polymer organic material including polyphenylene vinylene (PPV), polyfluorene, or the like by using a common method such as a screen printing method or an inkjet printing method.

However, aspects of the present embodiments are not limited to the aforementioned layers of the organic EML 115 and thus may vary.

The second electrode 116 corresponding to a common electrode of the organic light-emitting device OLED 117 is formed on the organic EML 115.

Similar to the first electrode 113, the second electrode 116 may be formed as a transparent electrode or a reflective electrode.

When the second electrode 116 is used as the transparent electrode, the second electrode 116 may be formed in a manner that a metal material having a small work function, e.g., Li, Ca, LiF/Ca, LiF/Al, Al, Mg or compound of any of these, is deposited on the organic EML 115 and then an auxiliary electrode comprising a transparent electrode forming material such as ITO, IZO, ZnO, $In_2O_3$ or the like is formed thereon.

When the second electrode 116 is used as the reflective electrode, the second electrode 116 may be formed by depositing Li, Ca, LiF/Ca, LiF/Al, Al, Mg or compound of any of these on an entire display region.

When the first electrode 113 is formed as a transparent electrode or a reflective electrode, the first electrode 113 may have a shape that corresponds to an opening of each sub-pixel. On the other hand, the second electrode 116 is formed by depositing a transparent electrode or a reflective electrode. Alternatively, the second electrode 116 may not be deposited on the entire display region but may have different patterns. Also, positions of the first electrode 113 and the second electrode 116 may be switched.

The first electrode 113 and the second electrode 116 are insulated from each other by the organic EML 115. When a voltage is applied to the first electrode 113 and the second electrode 116, visible light is emitted from the organic EML 115, so that an image that is recognizable to a user is realized.

In the cathode contact area C/C/A, the second electrode 116 is equally and electrically connected to the wiring 131.

Here, the height of the organic light-emitting device OLED 117 including the first electrode 113, the organic EML 115, and the second electrode 116 is less than a height of the fourth insulating layer 114 in the pad area PAD.

Figure 1C:
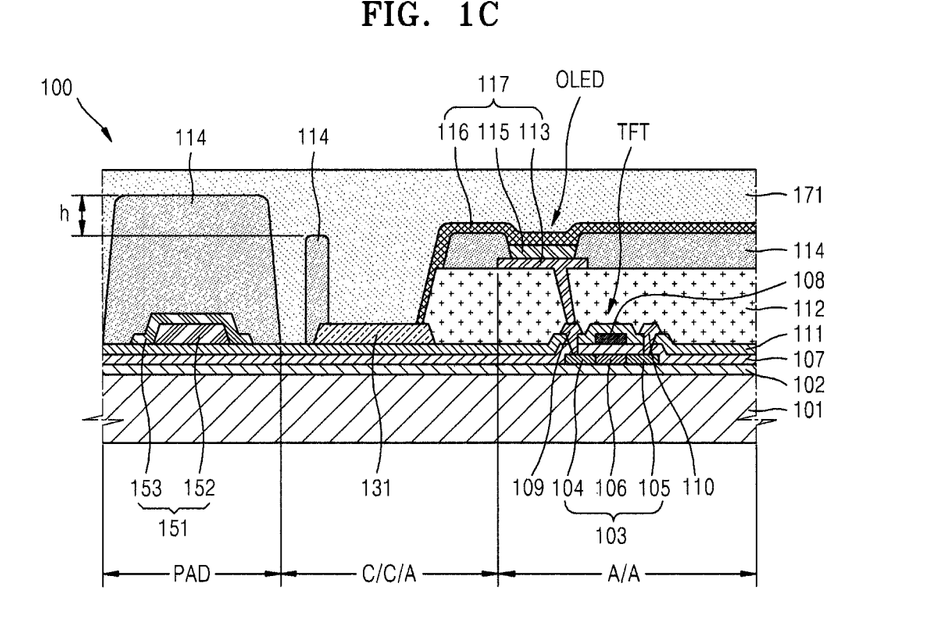
FIG. 1C is a cross-sectional view illustrating a status of the organic light-emitting display device after a raw material of an encapsulation thin-film layer is coated on the substrate of FIG. 1B.

After the organic light-emitting device OLED 117 is formed, as illustrated in FIG. 1C, an encapsulation thin-film layer 171 is coated to cover all of the active area A/A, the cathode contact area C/C/A, and the pad area PAD. The encapsulation thin-film layer 171 is formed to protect the organic EML 115 and other thin-films against exterior moisture or oxygen.

The encapsulation thin-film layer 171 may comprise an inorganic material selected from the group consisting of polysilazane containing $SiO_2$ as a main component, borate glass containing $B_2O_3$ as a main component, phosphate glass containing $P_2O_5$ as a main component, tellurite-based composition containing $TeO_2$ as a main component, bismuth oxide-based composition containing $Bi_2O_3$ as a main component, and chalcogenide-based composition containing at least one element selected from the group consisting of S, Se, and Te.

Various methods including a wet coating method may be used to form a film including a polysilazane material.

The polysilazane material is transformed into a $SiO_2$ inorganic film at a temperature equal to or less than about 200° C. and is a high-strength material having hardness of at least 8H. Also, the polysilazane material is advantageous in coating a thin-film layer having a step difference as in the active area A/A, the cathode contact area C/C/A, and the pad area PAD, and has excellent adhesion to the thin-film layer formed therebelow. A liquid containing the polysilazane material includes a catalyst so as to make the polysilazane material ceramified.

After the coating of the encapsulation thin-film layer 171 is complete, the encapsulation thin-film layer 171 is thermally hardened at a low temperature equal to or less than about 200° C. or at a high temperature.

Figure 1D:
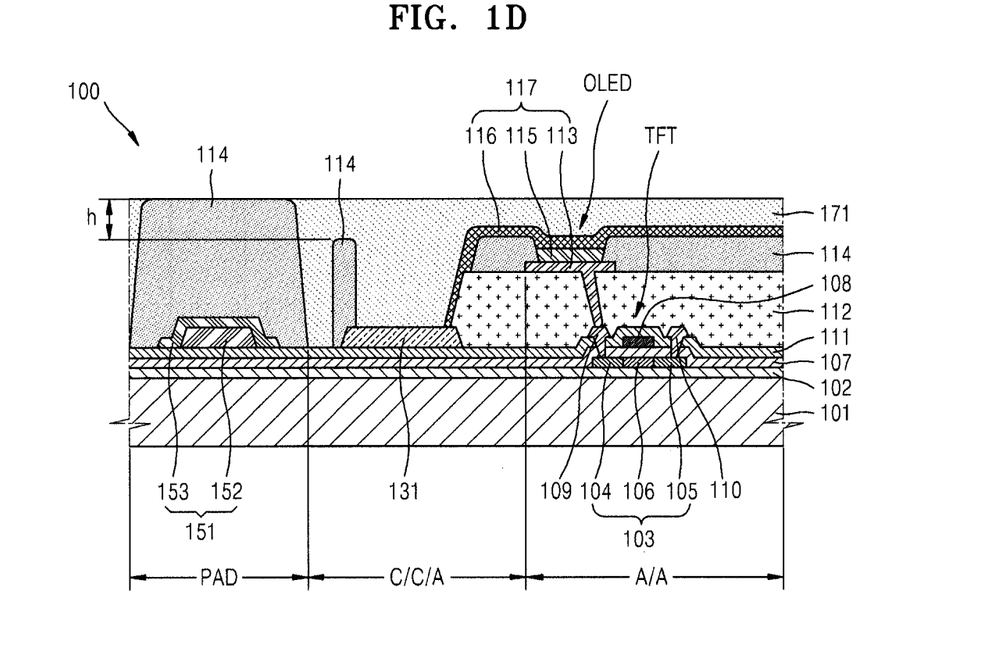
FIG. 1D is a cross-sectional view illustrating a status of the organic light-emitting display device after the raw material of the encapsulation thin-film layer of FIG. 1C is etched.

After the encapsulation thin-film layer 171 is thermally hardened, as illustrated in FIG. 1D, the encapsulation thin-film layer 171 is etched (operation S50).

When the encapsulation thin-film layer 171 is etched, the etching operation is performed until a top surface of the fourth insulating layer 114 formed in the pad area PAD is externally exposed. When the top surface of the fourth insulating layer 114 is exposed, the fourth insulating layer 114 and the second electrode 116 that are formed in the active area A/A and the cathode contact area C/C/A and that have lesser heights than a height of the fourth insulating layer 114 formed in the pad area PAD are not externally exposed but are covered by the encapsulation thin-film layer 171.

Figure 1E:
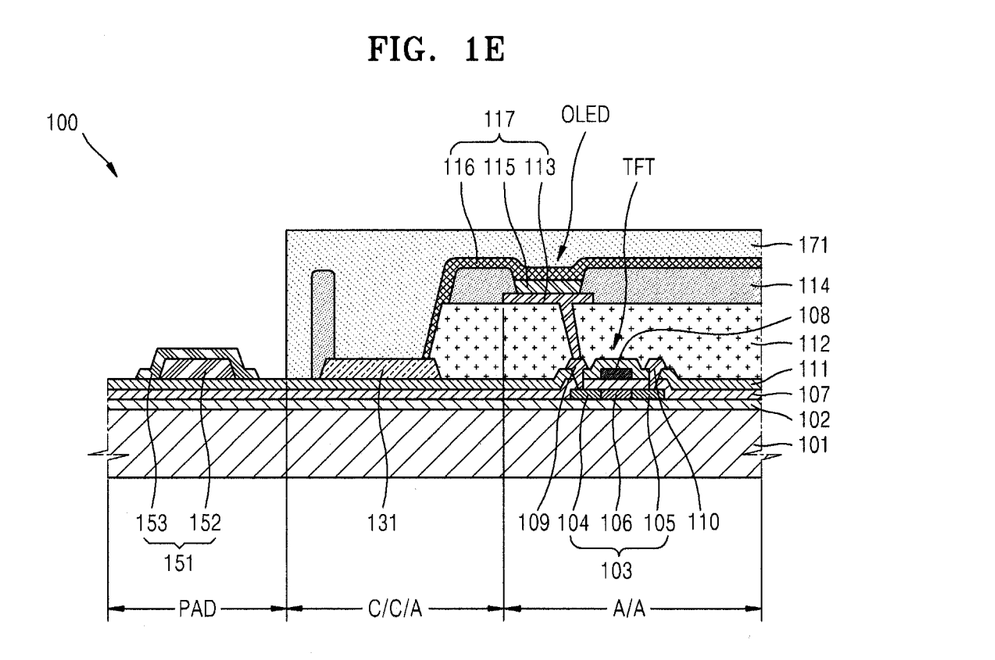
FIG. 1E is a cross-sectional view illustrating a status of the organic light-emitting display device after a pad area of FIG. 1D is developed.

After the etching operation is performed, as illustrated in FIG. 1E, the pad area PAD is developed (operation S60).

By developing the pad area PAD, the fourth insulating layer 114 formed in the pad area PAD is removed. Accordingly, the pad terminal 151 in the pad area PAD is externally exposed.

Through the aforementioned processes, respective thin-film layers may be formed in the active area A/A, the cathode contact area C/C/A, and the pad area PAD on the substrate 101, and then the substrate 101 may be coated by using the inorganic material so that the encapsulation thin-film layer 171 that is a single layer to encapsulate the thin-film layers from the outside may be formed on the substrate 101. As described above, the organic light-emitting display device 100 employs a thin-film type inorganic layer, instead of using thick-film type glass, so that the organic light-emitting display device 100 may have a decreased thickness and slimness.

Figure 3:
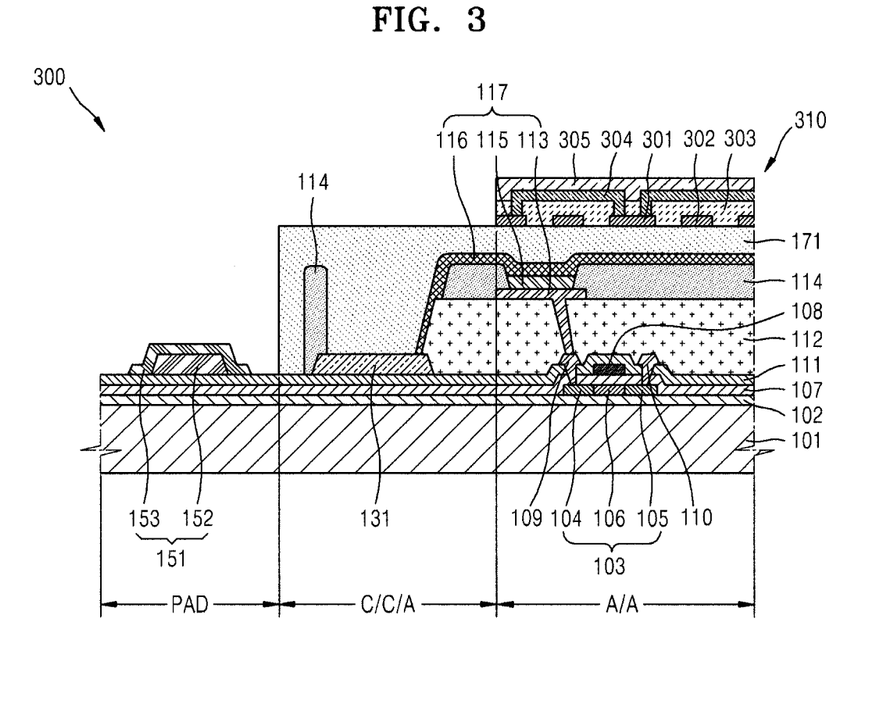
FIG. 3 is a cross-sectional view illustrating a status of an organic light-emitting display device after a touch screen is formed, according to another embodiment.

FIG. 3 is a cross-sectional view illustrating a status of an organic light-emitting display device 300 after a touch screen 310 is formed, according to another embodiment.

FIG. 3 illustrates a procedure after the development of the fourth insulating layer 114 is completed, and hereinafter, characteristic features of the present embodiment are described.

Referring to FIG. 3, the touch screen 310 is formed on the encapsulation thin-film layer 171. The touch screen 310 is formed at a region corresponding to the active area A/A of the substrate 101.

In the present embodiment, the touch screen 310 is an electrostatic capacitive-type touch unit. However, aspects of the present embodiments are not limited thereto and thus may also be applied to a touch unit selected from the group consisting of a resistive type touch unit, an electro-magnetic type touch unit, a surface acoustic wave type touch unit, a saw type touch unit, and an infrared type touch unit.

A plurality of first electrode pattern units 301 are formed in a first direction of the substrate 101, and a plurality of second electrode pattern units 302 are formed in a second direction of the substrate 101. The first electrode pattern units 301 and the second electrode pattern units 302 are arrayed while crossing each other. Here, the adjacent first electrode pattern units 301 are connected to each other via a connection unit 304. Although not illustrated, the adjacent second electrode pattern units 302 are connected to each other via another connection unit.

The first electrode pattern units 301 and the second electrode pattern units 302 may be formed as transparent conductive layers comprising a transparent material including ITO, IZO, ZnO, $In_2O_3$ or the like. Also, the first electrode pattern units 301 and the second electrode pattern units 302 may be formed via a photolithography procedure.

The first electrode pattern units 301 and the second electrode pattern units 302 may be formed by patterning the transparent conductive layers that are formed by using a method such as a depositing method, a spin coating method, a sputtering method, or an inkjet method.

The first electrode pattern units 301 and the second electrode pattern units 302 are covered by an insulating layer 303. The insulating layer 303 functions to insulate the first electrode pattern units 301 from the second electrode pattern units 302.

A protective layer 305 is formed above the insulating layer 303 so as to cover the connection unit 304 that connect the first electrode pattern units 301.

When an input means such as a finger approaches or contacts the touch screen 310 having the aforementioned structure, the touch screen 310 measures an electrostatic capacity that is changed between the first electrode pattern unit 301 and the second electrode pattern unit 302, thereby detecting a touch position.

The touch screen 310 indicates an on-cell touch screen panel (on-cell TSP) that is arranged by forming a touch screen pattern on a cell. The touch screen 310 may be directly and integrally formed on an exterior surface of the encapsulation thin-film layer 171 or may be formed on a substrate that is separately arranged.

In the present embodiment, the fourth insulating layer 114 in the pad area PAD may be removed via a development process during the photolithography procedure, and the pad terminal 151 in the pad area PAD may be externally exposed via the development process.

As described above, in the organic light-emitting display device and the method of manufacturing the same according to the one or more embodiments, the encapsulation thin-film layer comprising the inorganic material is singularly formed on the substrate via the coating, hardening, etching and developing processes, wherein the TFT and the EML are formed on the substrate, so that a thickness and a weight of the organic light-emitting display device may be decreased.

Also, since the insulating layer is patterned to have different thicknesses in the active area and the pad area, and then the encapsulation thin-film layer is singularly formed thereon, the manufacturing procedure is simplified.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. A method of manufacturing an organic light-emitting display device, the method comprising:
   forming pattern layers in an active area and a pad area, respectively, on a substrate; and
   forming an encapsulation thin-film layer that covers the pattern layers in the active area and the pad area on the substrate,
   wherein the forming of the encapsulation thin-film layer comprises forming the encapsulation thin-film layer on the substrate by using a raw material of the encapsulation thin-film layer that is a single layer comprising an inorganic material; and
   wherein the encapsulation thin-film layer comprises an inorganic material selected from the group consisting of borate glass containing $B_2O_3$ as a main component, phosphate glass containing $P_2O_5$ as a main component, tellurite-based composition containing $TeO_2$ as a main component, bismuth oxide-based composition containing $Bi_2O_3$ as a main component, and chalcogenide-based composition containing at least one element selected from the group consisting of S, Se, and Te.

2. The method of claim 1, wherein the forming of the pattern layers comprises:
   forming a semiconductor active layer, a first insulating layer, a gate electrode, a second insulating layer, source and drain electrodes, a third insulating layer, and a first electrode of an organic light-emitting device in the active area on the substrate, and forming a pad terminal in the pad area on the substrate;
   forming a fourth insulating layer that covers the first electrode while exposing a portion of the first electrode, and that covers the pad terminal; and
   forming an organic emission layer and a second electrode of the organic light-emitting device on the fourth insulating layer.

3. The method of claim 2, wherein
   the first through third insulating layers are formed while extending over the active area and the pad area on the substrate, and
   the source and drain electrodes, and the pad terminal are formed together on the third insulating layer.

4. The method of claim 2, wherein the pad terminal comprises a first part that comprises the same material as the gate electrode, and a second part that is formed on the first part by using the same material as the source electrode or the drain electrode.

5. The method of claim 2, wherein the forming of the fourth insulating layer comprises performing a half-tone exposure operation on a raw material of the fourth insulating layer in the active area and performing a non-exposure operation on a raw material of the fourth insulating layer in the pad area, wherein a thickness of the fourth insulating layer in the active area is different from a thickness of the fourth insulating layer in the pad area.

6. The method of claim 5, wherein the thickness of the fourth insulating layer in the pad area is greater than the thickness of the fourth insulating layer in the active area.

7. The method of claim 5, wherein a height of the organic light-emitting device having the first electrode, the organic EML, and the second electrode is less than a height of the fourth insulating layer in the pad area.

8. The method of claim 2, wherein the forming of the encapsulation thin-film layer comprises coating, hardening, and etching the raw material of the encapsulation thin-film layer that covers all of the active area and the pad area.

9. The method of claim 8, wherein the etching of the encapsulation thin-film layer comprises exposing a top surface of the fourth insulating layer formed in the pad area.

10. The method of claim 9, further comprising developing the fourth insulating layer so as to externally expose the pad terminal.

11. The method of claim 2, wherein a touch screen is further formed on a top surface of the fourth insulating layer formed in the active area.

12. The method of claim 11, wherein the touch screen comprises a plurality of first electrode pattern units that are arrayed in a first direction of the substrate, a plurality of second electrode pattern units that are arrayed in a second direction of the substrate, and an insulating layer that insulates the plurality of first electrode pattern units from the plurality of second electrode pattern units.

13. The method of claim 1, wherein the forming of the encapsulation thin-film layer comprises:
    coating the raw material of the encapsulation thin-film layer on the substrate;
    hardening the encapsulation thin-film layer at a temperature equal to or less than about 200° C.; and
    completing the encapsulation thin-film layer by etching the raw material of the encapsulation thin-film layer.

14. An organic light-emitting display device comprising:
    a substrate;
    a thin-film transistor (TFT) formed in an active area on the substrate, and comprising a semiconductor active layer, a first insulating layer, a gate electrode, a second insulating layer, source and drain electrodes, and a third insulating layer;
    an organic light-emitting device electrically connected to the TFT, and comprising a first electrode, an organic emission layer and a second electrode, wherein a portion of the first electrode is exposed by a fourth insulating layer;
    a pad terminal formed in a pad area on the substrate;
    an encapsulation thin-film layer covering the TFT and the organic light-emitting device, and formed as a single layer comprising an inorganic material; and
    wherein the encapsulation thin-film layer comprises an inorganic material selected from the group consisting of borate glass containing B2O3 as a main component, phosphate glass containing P2O5 as a main component, tellurite-based composition containing TeO2 as a main component, bismuth oxide-based composition containing Bi2O3 as a main component, and chalcogenide-based composition containing at least one element selected from the group consisting of S, Se, and Te.

15. The organic light-emitting display device of claim 14, wherein a touch screen is further formed on an exterior surface of the fourth insulating layer.

16. The organic light-emitting display device of claim 15, wherein the touch screen comprises:
    a plurality of first electrode pattern units that are arrayed in a first direction of the substrate;
    a plurality of second electrode pattern units that are arrayed in a second direction of the substrate and that cross the plurality of first electrode pattern units; and
    an insulating layer that insulates the plurality of first electrode pattern units from the plurality of second electrode pattern units.

17. An organic light-emitting display device manufactured by the method of claim 1.

18. An organic light-emitting display device manufactured by the method of claim 11.

* * * * *